United States Patent [19]

Sato et al.

[11] B 4,004,149

[45] Jan. 18, 1977

[54] APPARATUS FOR DISPLAYING IMAGE PRODUCED BY ELECTRICALLY CHARGED PARTICLE BEAM

[75] Inventors: Seishiro Sato, Hitachi; Toshihiro Furuya, Katsuta; Yasushi Saito, Mito, all of Japan

[73] Assignee: Hitachi, Ltd., Japan

[22] Filed: Apr. 18, 1975

[21] Appl. No.: 569,293

[44] Published under the second Trial Voluntary Protest Program on March 30, 1976 as document No. B 569,293.

[30] Foreign Application Priority Data

Apr. 22, 1974 Japan ............................ 49-44524

[52] U.S. Cl. .......................... 250/397; 250/396 R; 250/310; 250/311
[51] Int. Cl.² ........................................... H01J 3/26
[58] Field of Search .......... 250/396, 397, 310, 311, 250/306

[56] References Cited

UNITED STATES PATENTS

| 3,628,009 | 12/1971 | Dol et al. ........................ 250/397 |
| 3,711,711 | 1/1973 | Dao et al. ........................ 250/311 |
| 3,714,425 | 1/1973 | Someya ........................... 250/311 |
| 3,795,809 | 3/1974 | Takashima ....................... 250/397 |
| 3,842,272 | 10/1974 | Coates et al. ..................... 250/397 |
| 3,889,115 | 6/1975 | Tamura et al. ................... 250/397 |

Primary Examiner—Archie R. Borchelt
Assistant Examiner—B. C. Anderson
Attorney, Agent, or Firm—Craig & Antonelli

[57] ABSTRACT

A beam of electrically charged particles for illuminating a specimen is deflected by a deflection means so that the specimen is scanned with the beam bi-dimensionally. The information signal thus produced by the specimen is detected by a detector means and fed to a display apparatus incorporating therein another deflection means. The information signal is deflected by the latter deflection means to scan the display screen and is displayed thereon as an information image. A wave form of a signal produced in the latter deflection means is detected by a wave form detector means, the output of which is applied to the first mentioned deflection means to thereby deflect the electrically charged particle beam with a signal having a wave form similar to the detected one.

10 Claims, 6 Drawing Figures

APPARATUS FOR DISPLAYING IMAGE PRODUCED BY ELECTRICALLY CHARGED PARTICLE BEAM

BACKGROUND OF THE INVENTION

1. Field of the Invention

The present invention relates to a display apparatus for displaying an image produced by a beam of electrically charged particles with negligible image distortion.

2. Description of the Prior Art

The teaching of the present invention can be applied to apparatus provided with a plurality of deflection circuitries for the beams of electrically charged particles. However, for the better understanding of the invention, it will be described herein only exemplarily with reference to an electron microscope of the scanning type.

As is well known in the art, the electron microscope of the scanning type incorporates therein two deflection circuitries for electron beams. One of the deflection circuits is disposed in the body of the microscope and serves to scan a specimen with the accelerated primary electron beam bi-dimensionally. Then, the secondary electrons emitted by the specimen illuminated with the primary electrons are detected by a detector, the output signal of which is fed to a grid electrode of a cathode ray tube (hereinafter simply called CRT). The other one of the deflection circuit is disposed in the CRT and serves to deflect the electron beam modulated in dependence on the applied signal to thereby produce a magnified image of the specimen on the fluorescent screen of the CRT.

In general, the scanning speed of the scanning type electron microscope is slow as compared with the case of a television receiver. For example, the generation of a field of image by the scanning with the electron beam in the CRT for the electron microscope requires in most cases about 0.2 sec. With such slow scanning speed, flickers will occur in the produced image and provide difficulty for the observation. To evade such flickers, CRT having an image retaining property is employed at present. In case of the photographing, several tens seconds are required for the exposure to obtain a single image.

The above problem of the occurrence of flickers may be solved merely by increasing the scanning speed of the electron beam. However, when the scanning speed is increased to the degree at which the flickers will disappear, there will arise another problem that distortion will be produced in the image and make it impossible to obtain a magnified image of the specimen with a reliability required for the scanning type electron microscope. The cause of such distortion of the image can be explained by the fact that there is difference in the inductance value of the deflection coils disposed in the microscope and the CRT. In more detail, the scanning signals applied to the both deflection coil systems are synchronized with each other. When the deflection current is supplied to these deflection coils which have different inductance values, the wave forms of voltages appearing across these deflection coils will have non-similarity to each other, which gives rise to distortion in the magnified image displayed on the CRT. Such distortion becomes more remarkable, as the scanning speed is increased or the difference between the inductance values of the both coils becomes greater.

The difference in the inductance values of the deflection coils for the microscope and the CRT is ascribable to the inherently differed constructions and deflection ranges of the electron beams and thus is inevitable. For a numerical example, the inductance value of the deflection coil for the electron microscope is in the order of 0.1 mH, while that of the deflection coil for CRT is about 1 mH.

SUMMARY OF THE INVENTION

An object of the present invention is to provide a display apparatus for an image produced by a beam of electrically charged particles which can display a magnified image with negligible distortion.

Another object of the invention is to provide a display apparatus of the above type in which the scanning can be effected at a high speed without incurring distortion in the displayed image.

Still another object of the invention is to provide a display apparatus of the above mentioned type in which the range of variation in the scanning speed constituting an important factor for an optimum observation can be expanded.

In a preferred embodiment of the display apparatus for an image produced by the electrically charged particle beam, the specimen is illuminated and scanned by the electrically charged particle beam be-dimensionally through a deflection means. The information signal thus produced by the specimen is detected and fed to a display apparatus for displaying an enlarged or magnified image of the specimen. The display apparatus has also a deflection means for deflecting electron beam thereby to scan the display screen with the electron beam modulated by the above information signal. A detection means is provided for detecting the wave form of the voltage produced in the last mentioned deflection means. The output signal from the wave form detection means is fed to the first mentioned deflection means for deflecting the electrically charged particle beam, whereby the wave form of the voltage applied to the first mentioned deflection means has a similarity to that of the voltage signal produced in the last mentioned deflection coil.

The above and other objects as well as novel features and advantages of the present invention will become more apparent from the following description of preferred embodiments of the invention refering to the drawings.

DESCRIPTION OF THE PREFERRED EMBODIMENTS

Before entering into the description of the embodiments according to the present invention, a construction of the electron microscope of the scanning type as hereinbefore outlined will be again briefly described to elucidate the manner how the distortion is produced in the magnified image in dependence on the scanning speed.

Figure 1:
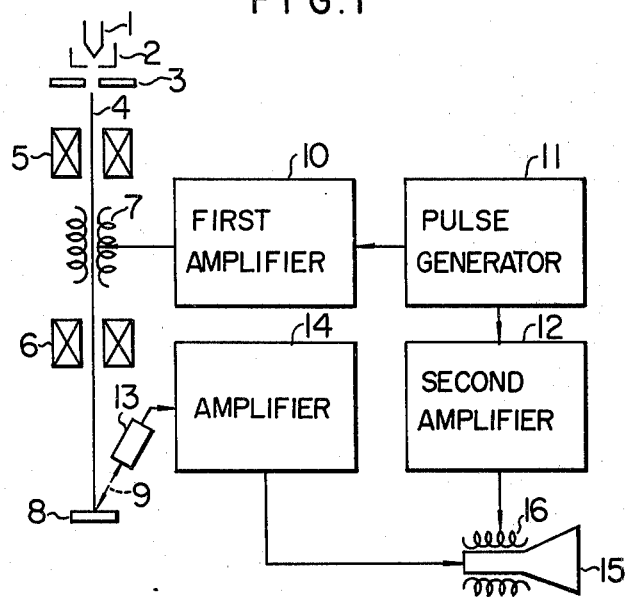
FIG. 1 shows schematically a hitherto known image display apparatus.

Referring to FIG. 1, a primary electron beam 4 emitted by an electron gun composed of a cathode 1, a Wehnelt cylinder 2 and an anode 3 is focussed by a condenser lens 5 into an extremely narrow beam and projected to the upper surface of a specimen 8 through an objective lens 6. Disposed between the condenser lens 5 and the objective lens 6 is a deflection coil 7 of the electron microscope which is applied with a pulse signal produced by a pulse generation circuit 11 and amplified by a first amplifier 10. The voltage produced in the deflection coil 7 will then be approximately of a saw-tooth wave form due to the inductance of the coil.

The primary electron beam 4 projected onto the specimen 8 will scan the latter bi-dimensionally under the control of the deflection coil 7 of the microscope. The surface of the specimen illuminated with the primary electron beam 4 will emit a secondary electron beam 9 which is detected by a detector 13. The output signal from the detector 13 is fed to a grid electrode (not shown) of a CRT 15 trough a signal amplifier 14. The CRT 15 has a deflection coil system 16 which is applied with the other output signal from the pulse generator circuit 11 through a second amplifier circuit 12. The electron beam produced in the CRT 15 is subjected to an intensity modulation by the signal from the amplifier 14 and deflected bi-dimensionally by the deflection coil 16 of the CRT whereby a magnified image of the specimen is displayed on the fluorescent screen 15 of the CRT 15.

Next, description will be made in detail about the occurrence of distortion in the magnified image due to the non-similarity in the wave forms of the deflecting voltages produced in the both deflection coils 7 and 16.

Figure 2:
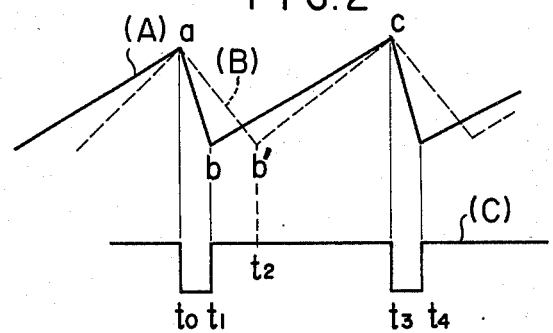
FIGS. 2 and 3 are diagrams for illustrating wave forms of signals for scanning operations and a raster pattern, respectively.
Figure 3:
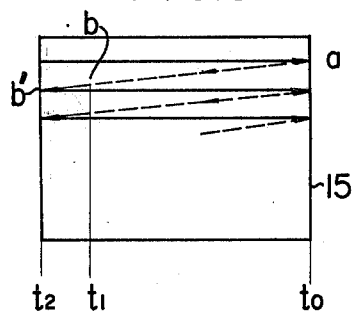

FIG. 2 illustrates by way of an example a relation between the wave form A of the deflecting voltage across the deflection coil of the microscope and the wave form B appearing across the deflection coil of the CRT. The wave form C represents the output signal from the pulse generator circuit 11 shown in FIG. 1. In FIG. 2, the time interval ($t_0 - t_1$) of the pulse signal C corresponds to the blanking period. During the interval ($t_1 - t_3$) of the pulse signal C, the specimen is scanned once by the electron beam under the influence of the deflection voltage of the wave form A. The time interval ($t_3 - t_4$) corresponds to the second blanking period. After the time point $t_4$, the second scanning is performed. As described above, the output from the pulse generator circuit 11 is applied also to the deflection coil of the CRT, the inductance value of which is differed from that of the deflection coil of the electron microscope. Assuming, for example, that the inductance value of the CRT deflection coil is larger than that of the deflection coil of the microscope, the wave form A will be varied as indicated by the curve a-b-c, while the variation in the wave form B of the deflection voltage of the CRT will take a form such as indicated by the curve a-b'-c. There exists apparently non-similarity between these wave forms A and B. As a result, distortion will occur in the image displayed on the screen of the CRT as is shown in FIG. 3 which schematically illustrates a raster pattern produced on the fluorescent screen of the CRT 15. Referring to FIG. 2, it is again assumed that the scanning of the specimen by the electron beam is started at the time point $t_1$ after the elapse of the blanking period corresponding to the time interval ($t_0 - t_1$). In this case, the building-up of the deflection voltage in the CRT deflection coil will occur at the time point $t_2$ with a delay to the building-up of the deflection voltage in the deflection coil of the microscope at the time point $t_1$ because of the difference in the inductance values of the respective coils. Accordingly, in the display on the fluorescent screen, the raster line extending from the point a shown in FIG. 3 corresponding to the completion of the first scanning and the initiation of the first blanking to the point $b'$ corresponding to the time point $t_2$ at which the second scanning is initiated is subjected to the intensity modulation even in the period over the time span between the points b and $b'$, since information signal is detected at the earlier time point $t_1$ corresponding to the point b in FIG. 3. Thus, it becomes impossible to display an enlarged image of the specimen with accuracy. In this connection, it will also be understood from the above description that the distortion in the generated image will become more remarkable, as the scanning speed is increased. Such undesirable phenomenon is ultimately ascribable to the non-similarity between the deflection wave forms A and B as illustrated in FIG. 2. Thus, it appears that the arrangement shown in FIG. 1 can not be satisfactorily employed for the scanning of a specimen at a high scanning speed.

Figure 4:
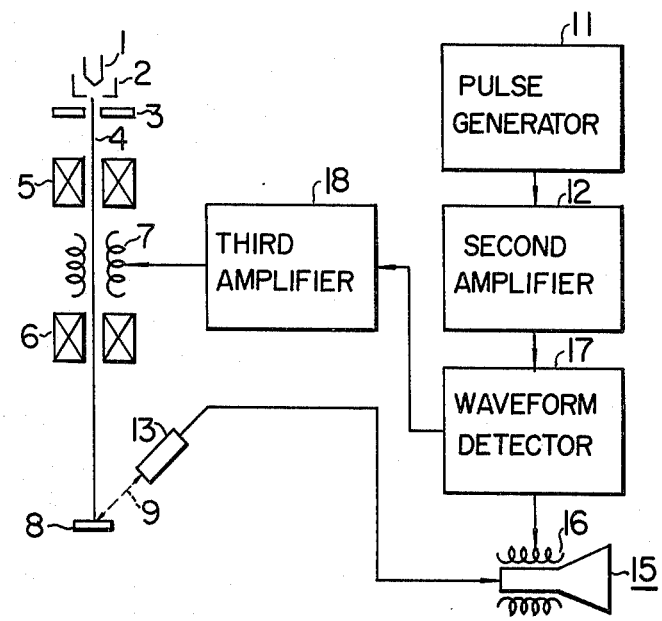
FIG. 4 shows schematically an arrangement of the image display apparatus according to the invention.

FIG. 4 shows an arrangement of an electron microscope of the scanning type according to the invention. Since the present invention is directed to the deflection circuitry for the electron beams, the following description will be restricted only to the deflection circuitry. Remaining portions of the scanning type electron microscope of FIG. 4 are substantially the same as those of the microscope of FIG. 1 and further description thereof will be unnecessary. It will be noted that the elements shown in FIG. 4 and designated by the same reference numerals as in FIG. 1 perform the same functions as those of the corresponding elements shown in FIG. 1.

As described hereinbefore, a factor causing the distortion in the magnified image produced on the CRT is the difference in the inductance value between the deflection coils employed in the microscope and the CRT which gives rise to the non-similarity in the wave forms of the deflection voltages produced in the respective coils. In general, when the scanning with the electron beam is carried out at a relatively low speed, the wave forms of the deflection voltages produced in the both deflection coils may have linear relation to the wave forms of the input voltages applied to the coils, because the influence of ohmic resistance of the coil is more prominent than that of the inductance at the low scanning speed. Accordingly, in such case, the deflection voltages produced in the coils of the microscope and the CRT have similarity in the wave forms thereof and involve scarcely distortion in the produced image. However, according to the present invention, it is contemplated to increase the scanning speed and at the same time maintain at least approximately the similarity between the wave forms of the deflection voltages produced in the both coils.

Now referring to FIG. 4, the output from the pulse generator circuit 11 is fed to the amplifier circuit 12 the output from which is applied to the deflection coil 16 of the CRT 15 through a wave form detector circuit 17. The applied signal is of a pulse form as is in the case of the apparatus shown in FIG. 1. The wave form detector circuit 17 serves to detect the wave form of the voltage appearing across the CRT deflection coil 16. In other words, the saw-tooth wave form voltage produced across the CRT deflection coil 16 by the pulse signal output from the amplifier circuit 12 is detected by the wave form detector circuit 17, the output from which is supplied to a third amplifier circuit 18 which produces a corresponding output signal applied to the deflection coil 7 of the electron microscope.

With the arrangement according to the invention as described above, it can be easily accomplished to apply to the deflection coil of the microscope a voltage of the similar wave from as that of the voltage produced in the deflection coil of the CRT, because the voltage produced in the deflection coil of the CRT is detected and utilized for the energization of the deflection coil of the microscope after having been linearly amplified. Even if the wave from of the voltage in the CRT deflection coil should suffer more or less distortion due to the increase in the scanning speed, the voltage of the wave form similar to the more or less distorted wave form is supplied to the deflection coil, whereby an distortion in the magnified image of the scanned specimen as described with reference to FIGS. 2 and 3 can be effectively suppressed.

In general, the deflection voltage produced in the deflection coil is more likely to be subjected to distortion in the wave from thereof, as the inductance value of the coil is increased. For this reason, it is obviously more effective for the suppression of distortion to detect the wave form of voltage produced in the one of both deflection coils having a larger inductance value and supply to the other deflection coil of a smaller inductance value after the linear amplification rather than to effect in the reverse manner.

Figure 5:
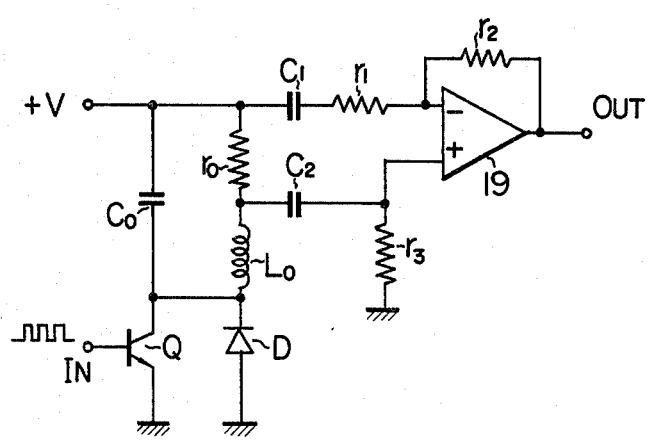
FIG. 5 is a circuit diagram of an exemplary wave form detector circuit according to the invention.

FIG. 5 shows an exemplary embodiment of the wave form detector circuit 17 employed in the arrangement according to the present invention. In FIG. 5, reference symbol $C_0$ denotes a capacitor, $r_0$ a wave form detection resistor, Q a transistor, D a diode, and $L_0$ a deflection coil which is assumed in this embodiment to be the coil provided in the CRT. These elements are connected in the manner shown in FIG. 5, whereby the signal appearing across the wave form detection resistor $r_0$ is coupled to an amplifier 19 through capacitors $C_1$ and $C_2$ for isolating d.c. current component. The gain of the amplifier 19 is determined by resistors $r_1$ and $r^2$. Resistor $r_3$ serves to apply a predetermined voltage to the positive terminal of the amplifier 19.

When a switching pulse which is the output pulse of the amplifier circuit 12 of FIG. 5 is applied to an input terminal IN with the predetermined d.c. voltage applied to the terminal +V, a saw-tooth wave current will flow through the deflection coil $L_{o12}$, as a result of which a corresponding saw-tooth wave voltage is produced across the wave form detection resistor $r_0$ connected in series to the deflection coil $L_0$. By supplying this voltage to the amplifier 19 through the capacitors $C_1$ and $C_2$, a voltage can be derived from the output terminal $O_{UT}$ of the amplifier 19, which voltage shares the similarity in the wave form with the deflection current flowing through the deflection coil $L_0$. It is to be noted that the output terminal $O_{UT}$ is coupled to the amplifier circuit 18 described above with reference to FIG. 4.

With the wave form detector circuit as described above, the voltage produced in the deflection coil of the CRT can be supplied to the deflection coil of the microscope through the amplifier in a simplified manner.

Figure 6:
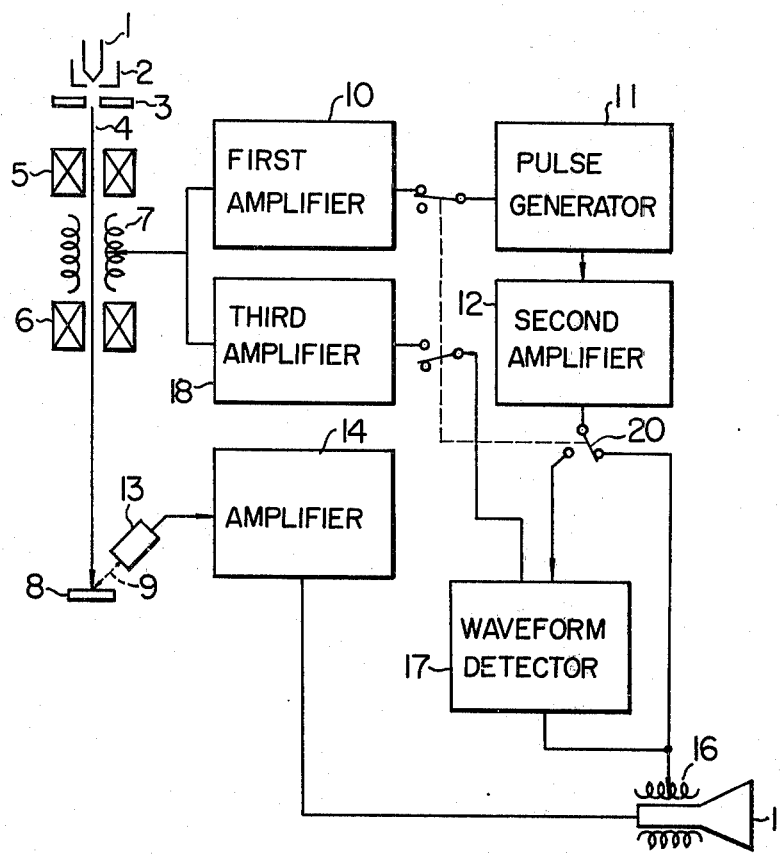
FIG. 6 shows a modification of the apparatus shown in FIG. 4.

FIG. 6 shows a modification of the embodiment shown in FIG. 4. The elements shown in FIG. 6 and designated by the same reference numerals as used in FIG. 4 perform the same functions as those of the corresponding elements shown in FIG. 4. The following description of the embodiment shown in FIG. 6 will be directed to the features which are not realized in the apparatus shown in FIG. 4.

Referring to FIG. 6, the apparatus is so arranged that the deflection scanning system of the prior art and the deflection means according to the invention may be changed over, when required. To this end, a ganged switching means 20 for three circuitries may be employed.

One of the two pulse signals produced by the pulse generator circuit 11 is fed to the amplifier circuit 10 through a change-over contact of the ganged switching means 20, the output from the amplifier circuit 10 being supplied to the deflection coil 7 of the microscope, while the other pulse signal from the circuit 11 is applied to the deflection coil 16 of the CRT through the amplifier 12 and a change-over contact of the ganged switch means 20 at the position shown in FIG. 6. This state of the apparatus corresponds to the conventional deflection scanning system described hereinbefore with reference to FIG. 1. On the other hand, when the ganged switch means 20 is changed over to the other position, the amplified deflection signal supplied from the pulse generator circuit 11 to the deflection coil of the microscope is interrupted and the pulse signal for the deflection coil 16 of the CRT is caused to pass through the wave form detector circuit 17 by the now changed-over ganged switch 20 on the way to the deflection coil 16, while the voltage produced in the deflection coil 16 is detected by the wave form detector circuit 17 and the resulted output signal is applied to the deflection coil 7 of the electron microscope through the amplifier circuit 18 and the changed-over ganged switch 20. It will be noted that the ganged switch means 20 is shown in FIG. 6 at the contact position at which the operation of the conventional scanning system can be performed.

As will be appreciated from the above description, by adding the change-over switch means 20 and the amplifier circuit 18 to the arrangement shown in FIG. 4, a specimen scanning and displaying system can be attained which is effectively evaded from flickers or image distortion as caused by difference in the inductance values of the both deflection coils even at the high speed scanning operation and additionally can be chanbed-over to the scanning operation of the conventional system which is rather suited to the low speed scanning. This means that the range of the utilizable scanning speed which constitutes one factor of the various conditions for the optimum observation of specimen is expanded and the observation can be carried out under the optimum conditions suited to the intended purpose.

In another preferred embodiment, the amplifier circuit 10 shown in FIG. 6 for supplying the deflection signal to the coil of the microscope may be composed of a switching amplifier, while the other amplifier circuit 18 may comprise a linear amplifier. With such arrangement, the switching amplifier usually having a rapid response characteristic can be used at the hig speed scanning operation. Further, the switching amplifier provides an additional advantage that the construction can be simplified. On the other hand, the linear amplifier used at the low scanning operation assures the required linearity between the input and the output signals thereof.

In the foregoing, the present invention has been described with reference to the embodiments applied to the electron microscopes of the scanning type provided with a display system. However, it should be appreciated that they serves merely for elucidation and the invention will never be restricted to the illustrated embodiments. For example, the invention can be applied to such apparatus as ion microanalizers, or X-ray analyzer systems. In brief, the teaching of the invention can be equally effectively applied to any system which comprises a deflection system for the beam electrically charged particles and another deflection system used for displaying information signal obtained by illuminating a specimen with the electrically charged particle beam.

We claim:

1. An apparatus for displaying an image produced by electrically charged particle beam, comprising first deflection means for scanning a specimen bi-dimensionally with said electrically charged particle beam, detection means for detecting information signal produced by said specimen illuminated with said electrically charged particle beam, display means for displaying an image of said specimen by utilizing said information signal detected by said detection means, second deflection means provided in said display means, and wave form detection means for detecting the wave form of a deflection signal produced in said second deflection means, whereby said first deflection means is energized by the output signal from said wave form detection means.

2. An apparatus as set forth in claim 1, wherein said wave form detection means comprises a resistor connected in series to said second deflection means, and capacitors connected in parallel thereto, whereby said first deflection means is energized by a deflection voltage produced across said resistor due to current flowing through said parallel circuit.

3. An apparatus as set forth in claim 1, further comprising a pulse generator circuit for producing a pulse signal, a second amplifier circuit for amplifying said pulse signal and means for supplying the output signal from said amplifier, wherein said wave form detection means comprises a resistor connected in series to said second deflection means and capacitors connected in parallel thereto, whereby said first deflection means is energized by a deflecting voltage produced across said resistor due to current flowing through said parallel circuit after said deflecting voltage have been amplified by a first amplifier circuit.

4. An apparatus as set forth in claim 1, further comprising first switching means for selectively supplying either the output signal from said wave form detection means or the pulse output signal from said pulse generator circuit to said first deflection means.

5. An apparatus as set forth in claim 4, further comprising second switching means for selectively applying said output signal from said second amplifier circuit to said second deflection means either directly or indirectly through said wave form detection means.

6. An apparatus as set forth in claim 4, further comprising means for interlocking said first and second switching means with each other.

7. An apparatus as set forth in claim 3, further comprising switching means for selectively supplying to said first deflection means either the output signal from said wave form detection means or the pulse output signal from said pulse generator circuit.

8. An apparatus as set forth in claim 2, further comprising switching means for selectively supplying to said first deflection means either the output signal from said wave form detection means or the pulse output signal from said pulse generator circuit.

9. An apparatus as set forth in claim 8, further comprising another switching means for selectively applying said output signal from said second amplifier circuit to said second deflection means either directly or indirectly through said wave form detection circuit.

10. An apparatus as set forth in claim 7, further comprising another switching means for selectively applying said output signal from said second amplifier circuit to said second deflection means either directly or indirectly through said wave form detection means.

* * * * *